(12) United States Patent
Hatakeyama et al.

(10) Patent No.: US 12,512,821 B2
(45) Date of Patent: Dec. 30, 2025

(54) MULTIPLEXER

(71) Applicant: TAIYO YUDEN CO., LTD., Tokyo (JP)

(72) Inventors: Kazushige Hatakeyama, Tokyo (JP); Jyunichi Hamasaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 287 days.

(21) Appl. No.: 18/179,854

(22) Filed: Mar. 7, 2023

(65) Prior Publication Data

US 2023/0291389 A1 Sep. 14, 2023

(30) Foreign Application Priority Data

Mar. 14, 2022 (JP) .................................. 2022-039262

(51) Int. Cl.
  *H03H 9/72* (2006.01)
  *H03H 9/05* (2006.01)
  *H03H 9/70* (2006.01)

(52) U.S. Cl.
  CPC .......... *H03H 9/725* (2013.01); *H03H 9/0566* (2013.01); *H03H 9/706* (2013.01)

(58) Field of Classification Search
  CPC .......... H03H 9/6483; H03H 7/46; H03H 9/25; H03H 9/0547; H03H 9/0566; H03H 9/706;

(Continued)

(56) References Cited

U.S. PATENT DOCUMENTS

2013/0127565 A1   5/2013   Nishihara et al.
2017/0294895 A1   10/2017  Kakita et al.
(Continued)

FOREIGN PATENT DOCUMENTS

JP   2007-67617 A    3/2007
JP   2013-110655 A   6/2013
(Continued)

OTHER PUBLICATIONS

Japanese Office Action dated Nov. 11, 2025 in a counterpart Japanese patent application No. 2022-039262. (A machine translation (not reviewed for accuracy) attached.).

*Primary Examiner* — Andrea Lindgren Baltzell
*Assistant Examiner* — Victor Cole
(74) *Attorney, Agent, or Firm* — CHEN YOSHIMURA LLP

(57) ABSTRACT

A multiplexer includes a transmit filter including first acoustic wave resonators connected to a first path between a common terminal and a transmit terminal, one or some first acoustic wave resonators of the first acoustic wave resonators being provided on a first substrate, and a remaining first acoustic wave resonator being provided on a second substrate, and a receive filter including second acoustic wave resonators connected to a second path between the common terminal and a receive terminal, one or some second acoustic wave resonators of the second acoustic wave resonators being provided on the first substrate and a remaining second acoustic wave resonator being provided on the second substrate, and a resonator closest to the receive terminal in a plan view among the one or some first and second acoustic wave resonators being a second acoustic wave resonator of the one or some second acoustic wave resonators.

8 Claims, 9 Drawing Sheets

(58) Field of Classification Search
CPC .... H03H 9/725; H03H 9/568; H03H 9/02574; H03H 9/131; H03H 9/132; H03H 9/205
USPC ................................................ 333/186, 193
See application file for complete search history.

(56) References Cited

U.S. PATENT DOCUMENTS

| | | | |
|---|---|---|---|
| 2017/0346463 A1* | 11/2017 | Hatakeyama | H03H 9/64 |
| 2018/0278238 A1* | 9/2018 | Kuroyanagi | H03H 9/70 |
| 2019/0312568 A1* | 10/2019 | Isaka | H03H 9/605 |
| 2022/0069797 A1* | 3/2022 | Kim | H03H 3/02 |
| 2022/0321101 A1* | 10/2022 | Liu | H03F 3/195 |
| 2023/0017921 A1 | 1/2023 | Yamaji | |
| 2023/0291387 A1* | 9/2023 | Wakasugi | H03H 9/0547 |

FOREIGN PATENT DOCUMENTS

| | | |
|---|---|---|
| JP | 2017-188807 A | 10/2017 |
| JP | 2020-155967 A | 9/2020 |
| WO | 2021/200280 A1 | 10/2021 |

\* cited by examiner

MULTIPLEXER

FIELD

This application claims benefit of foreign application, 2022-039262, filed in Japan on Mar. 14, 2022.

A certain aspect of the present disclosure relates to a multiplexer.

BACKGROUND

For miniaturization, it is known to mount two substrates each having a filter formed thereon so that the surfaces on which the filters are formed face each other across an air gap as disclosed in, for example, Japanese Patent Application Laid-Open No. 2007-67617 (Patent Document 1). In this case, it is known that by forming a transmit filter on the lower substrate, the heat dissipation of the transmit filter is enhanced and the reliability in power durability is improved as disclosed in, for example, Patent Document 1. In addition, it is known that electrode fingers of interdigital transducers (IDTs) that are formed on two opposing substrates, respectively, so as to face each other are made to be not parallel to each other as disclosed in, for example, Japanese Patent Application Laid-Open No. 2017-188807 (Patent Document 2). This configuration inhibits degradation in isolation characteristics.

Further, it is known that each of a transmit filter and a receive filter is divided into two sub-filters, the two sub-filters constituting the transmit filter are formed on two opposing substrates, respectively, so as to face each other, and the two sub-filters constituting the receive filter are formed on the two opposing substrates, respectively, so as to face each other as disclosed in, for example, Japanese Patent Application Laid-Open No. 2020-155967 (Patent Document 3). This configuration inhibits degradation in isolation characteristics.

RELATED ART DOCUMENTS

Patent Documents

Japanese Patent Application Laid-Open No. 2007-67617;
Japanese Patent Application Laid-Open No. 2017-188807;
Japanese Patent Application Laid-Open No. 2020-155967.

SUMMARY

However, in Patent Documents 1 to 3, there is room for improvement in terms of achieving both improvement in reliability in power durability and suppression of deterioration in isolation characteristics.

An object of the present disclosure is to achieve both improvement in reliability in power durability and suppression of deterioration in isolation characteristics.

In one aspect of the present disclosure, there is provided a multiplexer including: a first substrate having a first surface and a second surface, the first surface and the second surface being opposite to each other; a second substrate that has a third surface and is mounted over the first substrate with an air gap interposed between the first surface and the second substrate; a common terminal, a transmit terminal, and a receive terminal provided on the second surface; a transmit filter including a plurality of first acoustic wave resonators connected to a first path between the common terminal and the transmit terminal, one or some first acoustic wave resonators of the plurality of first acoustic wave resonators being provided on the first surface, and a remaining first acoustic wave resonator being provided on the third surface; and a receive filter including a plurality of second acoustic wave resonators connected to a second path between the common terminal and the receive terminal, one or some second acoustic wave resonators of the plurality of second acoustic wave resonators being provided on the first surface, and a remaining second acoustic wave resonator being provided on the third surface, and a resonator closest to the receive terminal in a plan view among the one or some first acoustic wave resonators and the one or some second acoustic wave resonators being a second acoustic wave resonator of the one or some second acoustic wave resonators.

In the above multiplexer, in a plan view, the second acoustic wave resonator closest to the receive terminal may be provided on a minimum distance between the receive terminal and a first acoustic wave resonator closest to the receive terminal among the one or some first acoustic wave resonators.

In the above multiplexer, a resonator closest to the transmit terminal in a plan view among the one or some first acoustic wave resonators and the one or some second acoustic wave resonators may be a first acoustic wave resonator of the one or some first acoustic wave resonators.

In the above multiplexer, the plurality of first acoustic wave resonators may include a plurality of first series resonators connected in series with the first path and a plurality of first parallel resonators each having a first end connected to the first path and a second end connected to a ground, and the one or some first acoustic wave resonators may include a first series resonator closest to the transmit terminal in terms of electrical connection among the plurality of first series resonators, and a first parallel resonator closest to the transmit terminal in terms of electrical connection among the plurality of first parallel resonators.

In the above multiplexer, the remaining first acoustic wave resonator provided on the third surface may include: a first series resonator closest to the common terminal in terms of electrical connection among the plurality of first series resonators, and a first parallel resonator closest to the common terminal in terms of electrical connection among the plurality of first parallel resonators.

In the above multiplexer, the plurality of second acoustic wave resonators may include a second parallel resonator having a first end connected to the second path and a second end connected to a ground, and the second acoustic wave resonator closest to the receive terminal may be the second parallel resonator.

In the above multiplexer, the plurality of second acoustic wave resonators may include the second parallel resonator in a plurality, and the second acoustic wave resonator closest to the receive terminal may be a second parallel resonator closest to the common terminal in terms of electrical connection among the plurality of second parallel resonators.

In the above multiplexer, the plurality of second acoustic wave resonators may include a plurality of second series resonators connected in series with the second path and a plurality of second parallel resonators, and the remaining second acoustic wave resonator provided on the third surface may include a second series resonator closest to the receive terminal in terms of electrical connection among the plurality of second series resonators, and a second parallel resonator closest to the receive terminal in terms of electrical connection among the plurality of second parallel resonators.

In the above multiplexer, at least a part of the second acoustic wave resonator closest to the receive terminal may overlap the receive terminal in a plan view.

The above multiplexer may further include a shield layer provided between the one or some first acoustic wave resonators and the one or some second acoustic wave resonators, which are provided on the first surface, and the remaining first acoustic wave resonator and the remaining second acoustic wave resonator, which are provided on the third surface, the shield layer being connected to a ground.

BRIEF DESCRIPTION OF THE DRAWINGS

The brief description of the drawings is provided as follows.

DETAILED DESCRIPTION

Hereinafter, embodiments of the present disclosure will be described with reference to the drawings.

First Embodiment

Figure 1:
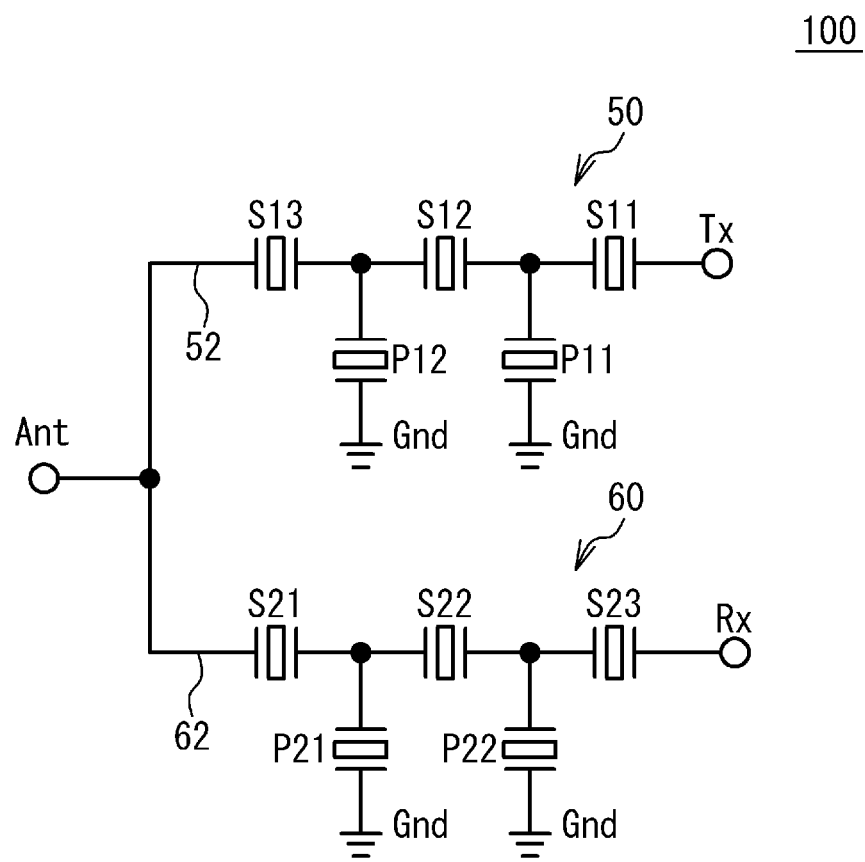
FIG. 1 is a circuit diagram of a multiplexer in accordance with a first embodiment.

FIG. 1 is a circuit diagram of a multiplexer 100 in accordance with a first embodiment. As illustrated in FIG. 1, a transmit filter 50 is connected between a common terminal Ant and a transmit terminal Tx. A receive filter 60 is connected between the common terminal Ant and a receive terminal Rx. The passband of the transmit filter 50 and the passband of the receive filter 60 do not overlap each other. The transmit filter 50 outputs, to the common terminal Ant, signals in the transmit band among high-frequency signals input to the transmit terminal Tx and suppresses signals in other frequency bands. The receive filter 60 outputs, to the receive terminal Rx, signals in the receive band among high-frequency signals input to the common terminal Ant, and suppresses signals in other frequency bands.

The transmit filter 50 is a ladder-type filter. The transmit filter 50 includes series resonators S11 to S13 connected in series between the transmit terminals Tx and the common terminal Ant and parallel resonators P11 and P12 connected in parallel between the transmit terminals Tx and the common terminal Ant. The series resonators S11 and S13 are provided in a series path 52 between the transmit terminal Tx and the common terminal Ant. First ends of the parallel resonators P11 and P12 are connected to the series path 52, and second ends thereof are connected to ground terminals Gnd.

The receive filter 60 is a ladder-type filter. The receive filter 60 includes series resonators S21 to S23 connected in series between the common terminal Ant and the receive terminal Rx and parallel resonators P21 and P22 connected in parallel between the common terminal Ant and the receive terminal Rx. The series resonators S21 to S23 are provided in a series path 62 between the common terminal Ant and the receive terminal Rx. First ends of the parallel resonators P21 and P22 are connected to the series path 62, and second ends thereof are connected to the ground terminals Gnd.

Figure 2:
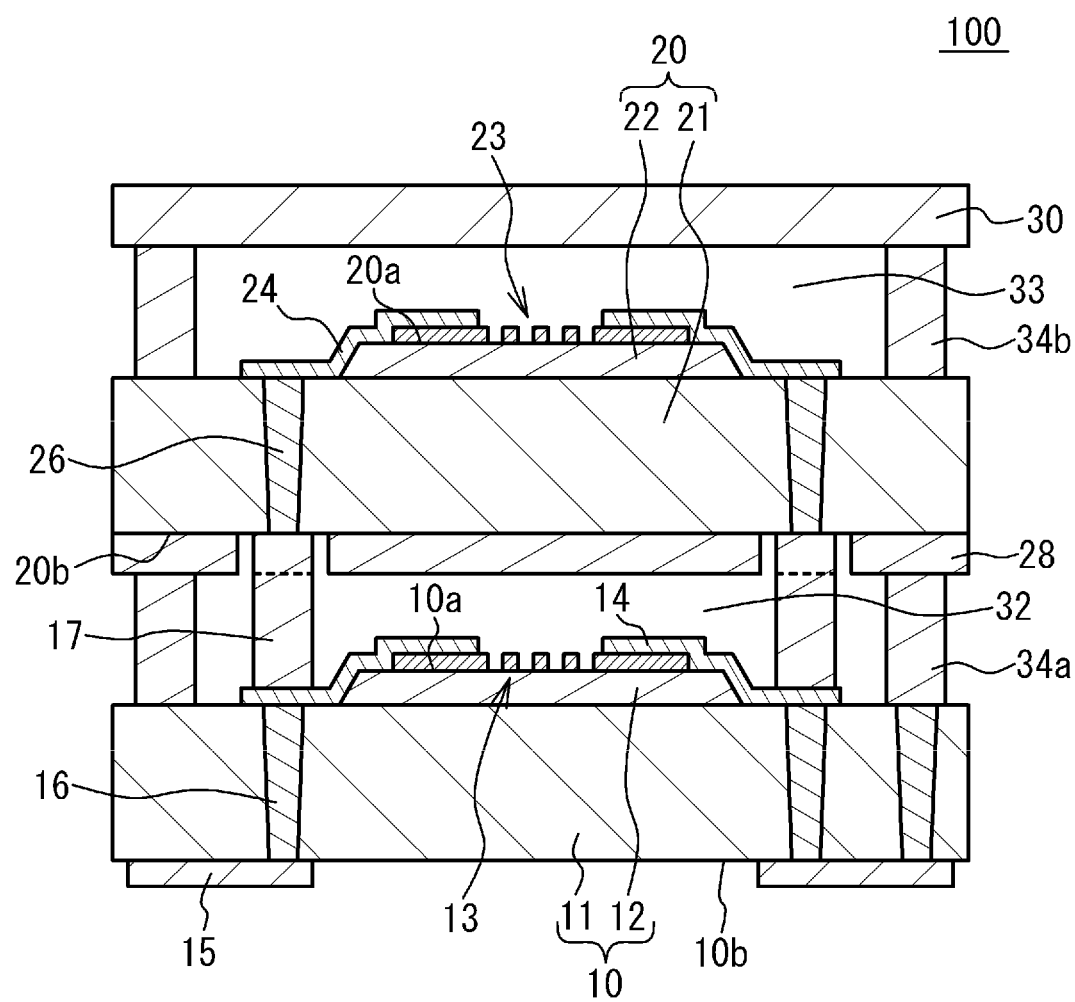
FIG. 2 is a cross-sectional view of the multiplexer in accordance with the first embodiment.

FIG. 2 is a cross-sectional view of the multiplexer 100 in accordance with the first embodiment. As illustrated in FIG. 2, a substrate 20 is mounted over a substrate 10, and a lid 30 is mounted over the substrate 20. The substrate 10 includes a support substrate 11 and a piezoelectric substrate 12 bonded on the support substrate 11. Similarly, the substrate 20 includes a support substrate 21 and a piezoelectric substrate 22 bonded on the support substrate 21. The support substrates 11 and 21 are, for example, sapphire substrates, spinel substrates, alumina substrates, quartz substrates, or silicon substrates. The piezoelectric substrates 12 and 22 are, for example, lithium tantalate substrates or lithium niobate substrates.

Acoustic wave resonators 13 and wiring lines 14 are provided on the upper surface 10a of the substrate 10. Terminals 15 are provided on the lower surface 10b of the substrate 10. The terminals 15 are foot pads for connecting acoustic wave resonators 13 and 23 to an external element. Via wirings 16 penetrating through the substrate 10 are provided. The via wirings 16 electrically connect the wiring lines 14 and the terminals 15. The wiring lines 14, the terminals 15, and the via wirings 16 are, for example, metal layers such as copper layers, aluminum layers, or gold layers. The terminals 15 include the common terminal Ant, the transmit terminal Tx, the receive terminal Rx, and the ground terminals Gnd.

The acoustic wave resonators 23 and wiring lines 24 are provided on the upper surface 20a of the substrate 20. A shield layer 28 is provided on the lower surface 20b of the substrate 20. The shield layer 28 has a function of shielding electromagnetic waves between the acoustic wave resonators 13 and the acoustic wave resonators 23. Via wirings 26 penetrating through the substrate 20 are provided. The via wirings 26 are electrically connected to the wiring lines 14 through pillars 17. The wiring lines 24 and the via wirings 26 are, for example, metal layers such as copper layers, aluminum layers, or gold layers. The shield layer 28 includes, for example, a conductive metal layer such as a copper layer, a silver layer, a tungsten layer, an aluminum layer, or a titanium layer, or a magnetic metal layer such as an iron layer, a nickel layer, or an iron-nickel alloy layer. The thickness of the shield layer 28 is preferably equal to or greater than the skin depth of the electromagnetic wave to be shielded. The pillar 17 is a metal layer including, for example, a copper layer, a gold layer, a silver layer, an aluminum layer, or the like.

The upper surface 10a of the substrate 10 and the lower surface 20b of the substrate 20 face each other across an air gap 32. A sealing portion 34a is provided between the substrate 10 and the substrate 20 so as to surround the acoustic wave resonators 13 and the wiring lines 14. The sealing portion 34a seals the acoustic wave resonators 13 and the wiring lines 14 in the air gap 32. The sealing portion 34a is a metal layer including, for example, a nickel layer, a copper layer, a gold layer, or the like. The sealing portion 34a is electrically connected to the terminal 15 serving as the ground terminal Gnd through the via wiring 16. The shield layer 28 is electrically connected to the sealing portion 34a and is electrically connected to the terminal 15 serving as the ground terminal Gnd.

The lid 30 and the upper surface 20a of the substrate 20 face each other across an air gap 33. A sealing portion 34b is provided between the substrate 20 and the lid 30 so as to surround the acoustic wave resonators 23 and the wiring lines 24. The sealing portion 34b seals the acoustic wave resonators 23 and the wiring lines 24 in the air gap 33. The lid 30 is, for example, an insulating plate such as a sapphire substrate or a metal plate such as a nickel-cobalt ferrous alloy substrate. The sealing portion 34b is a metal layer including, for example, a nickel layer, a copper layer, a gold layer, or the like. The sealing portion 34b may be electrically connected to the shield layer 28 by the via wiring 26 penetrating through the substrate 20. This configuration allows the sealing portion 34b and the lid 30 to be electrically connected to the ground terminal Gnd.

Figure 3A:
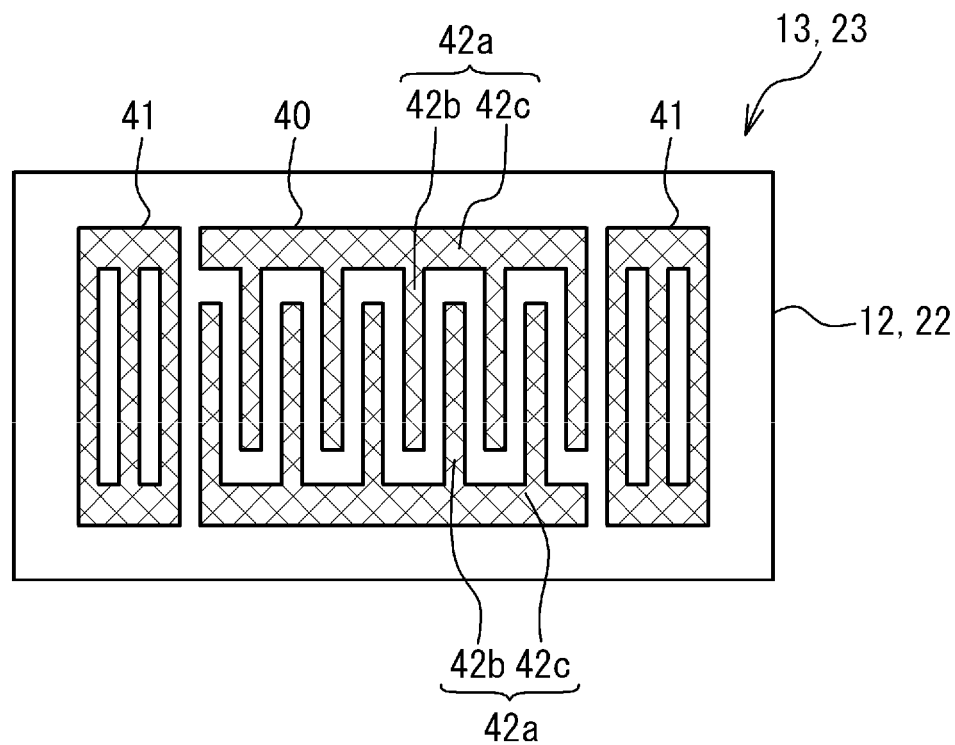
FIG. 3A is a plan view in the case that an acoustic wave resonator is a surface acoustic wave resonator.

Examples of the acoustic wave resonators 13 and 23 will be described with reference to FIG. 3A and FIG. 3B. FIG. 3A is a plan view in the case in which the acoustic wave resonators 13 and 23 are surface acoustic wave resonators. As illustrated in FIG. 3A, an interdigital transducer (IDT) 40 and reflectors 41 are formed on each of the piezoelectric substrates 12 and 22. The IDT 40 includes a pair of comb-shaped electrodes 42a facing each other. The comb-shaped electrodes 42a include a plurality of electrode fingers 42b and a bus bar 42c connecting the plurality of electrode fingers 42b. The reflectors 41 are provided at both sides of the IDT 40. The IDT 40 excites a surface acoustic wave on each of the piezoelectric substrates 12 and 22. The IDT 40 and the reflectors 41 are formed of, for example, an aluminum film or a copper film. As illustrated in FIG. 2, the piezoelectric substrates 12 and 22 may be bonded on the support substrates 11 and 21, respectively, or the support substrates 11 and 21 are not provided, and the substrates 10 and 20 may be the piezoelectric substrates 12 and 22 alone, respectively. An insulating film such as a silicon oxide film or an aluminum oxide film may be provided between the support substrate 11 and the piezoelectric substrate 12 and between the support substrate 21 and the piezoelectric substrate 22. A protective film or a temperature compensation film may be provided on each of the substrates 10 and 20 so as to cover the IDT 40 and the reflectors 41.

Figure 3B:
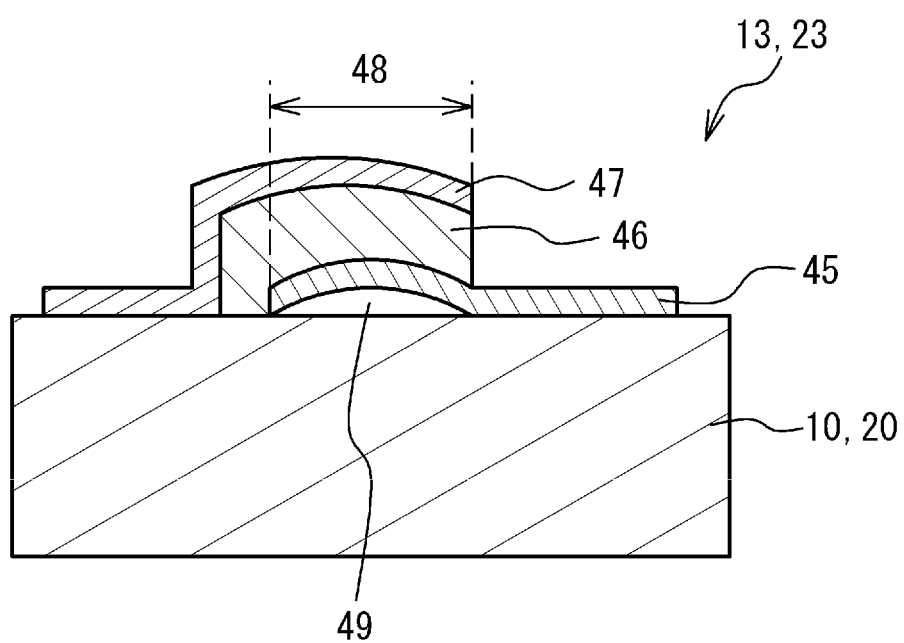
FIG. 3B is a cross-sectional view in the case that the acoustic wave resonator is a piezoelectric thin film resonator.

FIG. 3B is a cross-sectional view in a case in which the acoustic wave resonators 13 and 23 are piezoelectric thin film resonators. As illustrated in FIG. 3B, a piezoelectric film 46 is provided on each of the substrates 10 and 20. A lower electrode 45 and an upper electrode 47 are provided so as to sandwich the piezoelectric film 46 therebetween. An air gap 49 is formed between the lower electrode 45 and each of the substrates 10 and 20. A region where the lower electrode 45 and the upper electrode 47 face each other across at least a part of the piezoelectric film 46 is a resonance region 48. The lower electrode 45 and the upper electrode 47 in the resonance region 48 excite an acoustic wave in the thickness extension mode in the piezoelectric film 46. The substrates 10 and 20 are, for example, sapphire substrates, spinel substrates, alumina substrates, glass substrates, quartz substrates, or silicon substrates. The lower electrode 45 and the upper electrode 47 are each a metal film such as a ruthenium film. The piezoelectric film 46 is, for example, an aluminum nitride film. Instead of the air gap 49, an acoustic mirror that reflects acoustic waves may be provided.

The acoustic wave resonators 13 and 23 include electrodes that excite acoustic waves. Therefore, as illustrated in FIG. 2, the acoustic wave resonator 13 is covered with the air gap 32, and the acoustic wave resonator 23 is covered with the air gap 33 so as not to disturb the excitation of the acoustic wave.

Figure 4A:
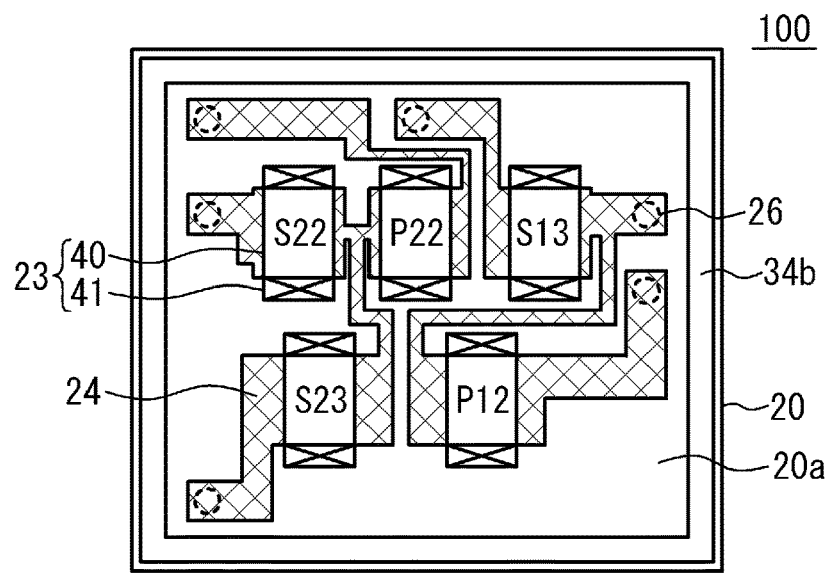
FIG. 4A to FIG. 4C are plan views of substrates in the first embodiment.
Figure 4B:
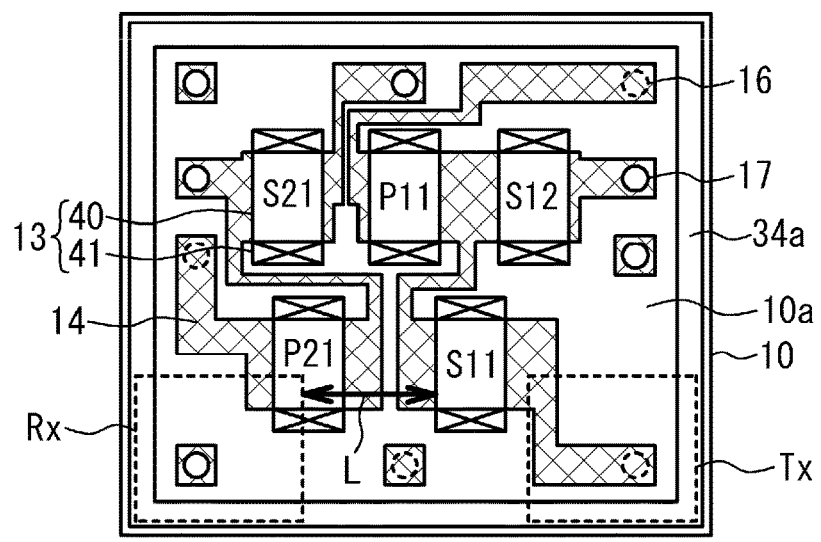
Figure 4C:
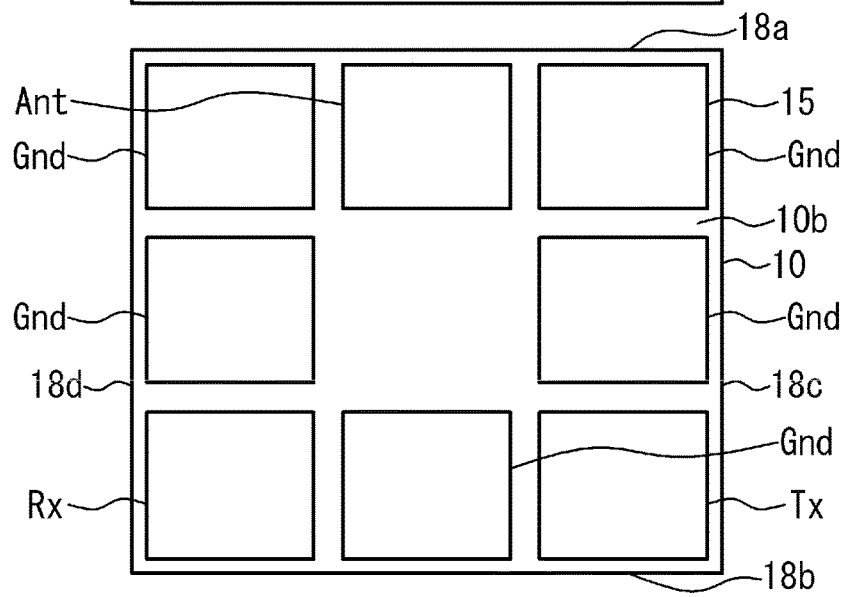

FIG. 4A to FIG. 4C are plan views of the substrates 10 and 20 in the first embodiment. FIG. 4A is a plan view of the upper surface 20a of the substrate 20 as viewed from above, FIG. 4B is a plan view of the upper surface 10a of the substrate 10 as viewed from above, and FIG. 4C is a plan view of the lower surface 10b of the substrate 10 as transparently viewed from above. In FIG. 4A and FIG. 4B, the wiring lines 14 and 24 are hatched for clarity. In FIG. 4B, the transmit terminal Tx and the receive terminal Rx formed on the lower surface 10b of the substrate 10 are indicated by dotted lines.

As illustrated in FIG. 4A, the acoustic wave resonators 23 and the wiring lines 24 are provided on the upper surface 20a of the substrate 20. The acoustic wave resonator 23 is a surface acoustic wave resonator including the IDT 40 and the reflectors 41. The wiring lines 24 are connected to the acoustic wave resonators 23. The sealing portion 34b is provided in the periphery of the substrate 20. The acoustic wave resonators 23 include the series resonator S13 and the parallel resonator P12 included in the transmit filter 50, and the series resonators S22 and S23 and the parallel resonator P22 included in the receive filter 60.

As illustrated in FIG. 4B, the acoustic wave resonators 13 and the wiring lines 14 are provided on the upper surface 10a of the substrate 10. The acoustic wave resonator 13 is a surface acoustic wave resonator including the IDT 40 and the reflectors 41. The wiring lines 14 are connected to the acoustic wave resonators 13. The sealing portion 34a is provided in the periphery of the substrate 10. The acoustic wave resonators 13 include the series resonators S11 and S12 and the parallel resonator P11 included in the transmit filter 50, and the series resonator S21 and the parallel resonator P21 included in the receive filter 60.

As illustrated in FIG. 4C, a plurality of the terminals 15 are provided on the lower surface 10b of the substrate 10. The terminals 15 include the common terminal Ant, the transmit terminal Tx, the receive terminal Rx, and the ground terminals Gnd. The lower surface 10b has sides 18a and 18b facing each other, and sides 18c and 18d facing each other. The common terminal Ant is provided near the center of one side 18a of a pair of the opposing sides 18a and 18b of the lower surface 10b, and the transmit terminal Tx and the receive terminal Rx are provided near respective ends of the other side 18b, respectively. That is, the transmit terminal Tx is provided near the corner between the sides 18b and 18c, and the receive terminal Rx is provided near the corner between the sides 18b and 18d. As described above, the common terminal Ant, the transmit terminal Tx, and the receive terminal Rx are provided at positions such that the intervals therebetween are large.

As illustrated in FIG. 4A to FIG. 4C, by the wiring lines 14, the via wirings 16, the pillars 17, the wiring lines 24, and the via wirings 26, the series resonators S11 to S13 of the transmit filter 50 are connected in series between the transmit terminal Tx and the common terminal Ant, and the parallel resonators P11 and P12 of the transmit filter 50 are connected in parallel between the transmit terminal Tx and the common terminal Ant. Similarly, by the wiring lines 14, the via wirings 16, the pillars 17, the wiring lines 24, and the via wirings 26, the series resonators S21 and S23 of the receive filter 60 are connected in series between the common terminal Ant and the receive terminal Rx, and the parallel resonators P21 and P22 of the receive filter 60 are connected in parallel between the common terminal Ant and the receive terminal Rx.

As illustrated in FIG. 4B, the series resonator S21 and the parallel resonator P21 included in the receive filter 60 are provided on the upper surface 10a of the substrate 10 so as to be closer to the side corresponding to the side 18d of the lower surface 10b of the substrate 10 than the series resonators S11 and S12 and the parallel resonator P11 included in the transmit filter 50. The parallel resonator P21 at least partially overlaps the receive terminal Rx in a plan view and is disposed closer to the receive terminal Rx than the series resonators S11 and S12 and the parallel resonator P11. In other words, the series resonators S11 and S12 and the parallel resonator P11 are provided farther from the receive terminal Rx than the parallel resonator P21 in a plan view.

The parallel resonator P21 is the resonator provided closest to the receive terminal Rx in a plan view among all the series resonators S11, S12, and S21 and the parallel resonators P11 and P21 provided on the upper surface 10a of the substrate 10. On the other hand, among the series resonators S11 and S12 and the parallel resonator P11 that are included in the transmit filter 50 and provided on the upper surface 10a of the substrate 10, the resonator provided closest to the receive terminal Rx in a plan view is the series resonator S11. Here, the resonator provided closest to the receive terminal Rx in a plan view refers to a resonator having the shortest minimum distance from the receive terminal Rx in a plan view. The series resonator S11 is also the resonator provided closest to the transmit terminal Tx among the series resonators S11 and S12 and the parallel resonator P11 that are included in the transmit filter 50 and provided on the upper surface 10a of the substrate 10. In a plan view, at least a part of the parallel resonator P21 is located on the minimum distance L between the receive terminal Rx and the series resonator S11.

In the resonators constituting the transmit filter 50, the series resonators S11 and S12 provided on the upper surface 10a of the substrate 10 at least partially overlap the parallel resonator P12 and the series resonator S13 provided on the upper surface 20a of the substrate 20, respectively. In the resonators constituting the receive filter 60, the series resonator S21 and the parallel resonator P21 provided on the upper surface 10a of the substrate 10 at least partially overlap the series resonator S22 and the series resonator S23 provided on the upper surface 20a of the substrate 20, respectively. As described above, in the plurality of resonators constituting the transmit filter 50, at least one of the resonators provided on the upper surface 10a of the substrate 10 and at least one of the resonators provided on the upper surface 20a of the substrate 20 are provided so as to at least partially overlap each other. The same applies to the plurality of resonators constituting the receive filter 60.

Manufacturing Method

An example of a method of manufacturing the acoustic wave device according to the first embodiment will be described. First, the substrate 10 and the substrate 20 are separately formed. The substrate 10 is formed by bonding the piezoelectric substrate 12 to the surface of the support substrate 11, and then thinning the piezoelectric substrate 12 to a desired thickness by polishing, grinding, or the like. The support substrate 11 and the piezoelectric substrate 12 are bonded to each other by, for example, a direct bonding method using room-temperature bonding by activating the surface of the support substrate 11 and the surface of the piezoelectric substrate 12. Then, the piezoelectric substrate 12 is etched to process the piezoelectric substrate 12 into a desired shape. Then, the via wirings 16 are formed in the support substrate 11, the acoustic wave resonators 13 are formed on the piezoelectric substrate 12, and the wiring lines 14 connected to the acoustic wave resonators 13 are formed. Then, the sealing portion 34a is formed in the periphery of the substrate 10, and the pillars 17 are formed on the wiring lines 14. Generally known methods are used to form the acoustic wave resonators 13, the wiring lines 14, the via wirings 16, the pillars 17, and the sealing portion 34a.

As for the substrate 20, the via wirings 26 are formed in the support substrate 21 bonded to the piezoelectric substrate 22, the acoustic wave resonators 23 are formed on the piezoelectric substrate 22, the wiring lines 24 connected to the acoustic wave resonators 23 are formed, and the sealing portion 34b is formed in the periphery of the substrate 20 using the same methods as those of the substrate 10. Thereafter, the lid 30 is mounted on the sealing portion 34b. Thus, the acoustic wave resonators 23 and the wiring lines 24 are sealed in the air gap 33 formed between the substrate 20 and the lid 30. Then, the substrate 20 is thinned to a desired thickness by polishing or grinding, and then the shield layer 28 is formed on the lower surface 20b of the substrate 20.

Then, the substrate 20 is mounted on the sealing portion 34b and the pillars 17 of the substrate 10. Thereby, the acoustic wave resonators 13 formed on the substrate 10 are sealed in the air gap 32 formed between the substrate 10 and the substrate 20. Then, the substrate 10 is thinned to a desired thickness by polishing or grinding, and a plurality of the terminals 15 are then formed on the lower surface 10b of the substrate 10.

Comparative Example

Figure 5A:
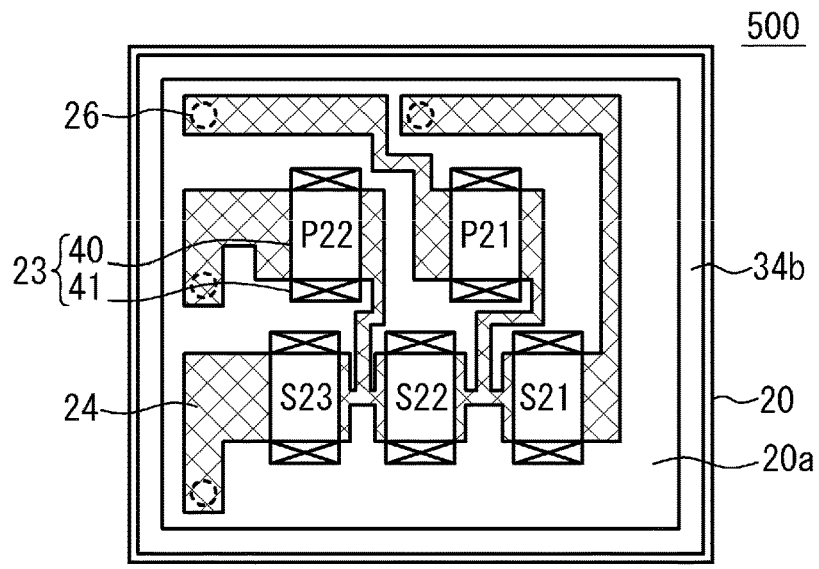
FIG. 5A to FIG. 5C are plan views of substrates in a comparative example.
Figure 5B:
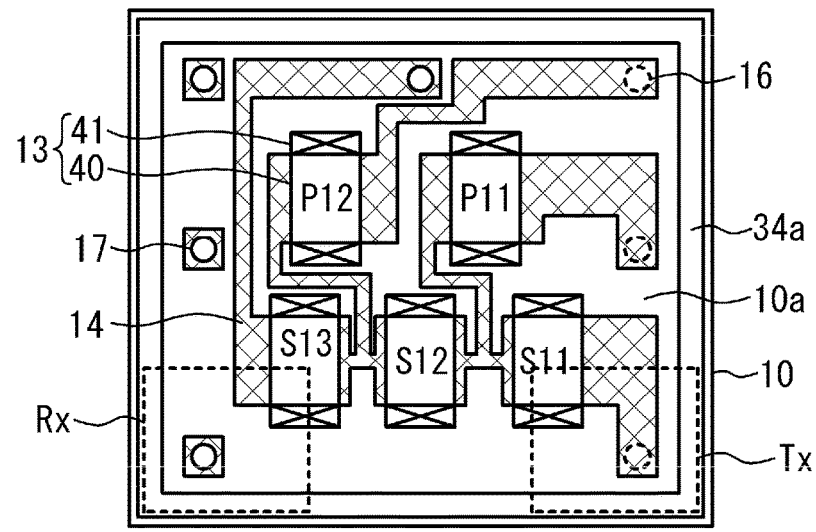
Figure 5C:
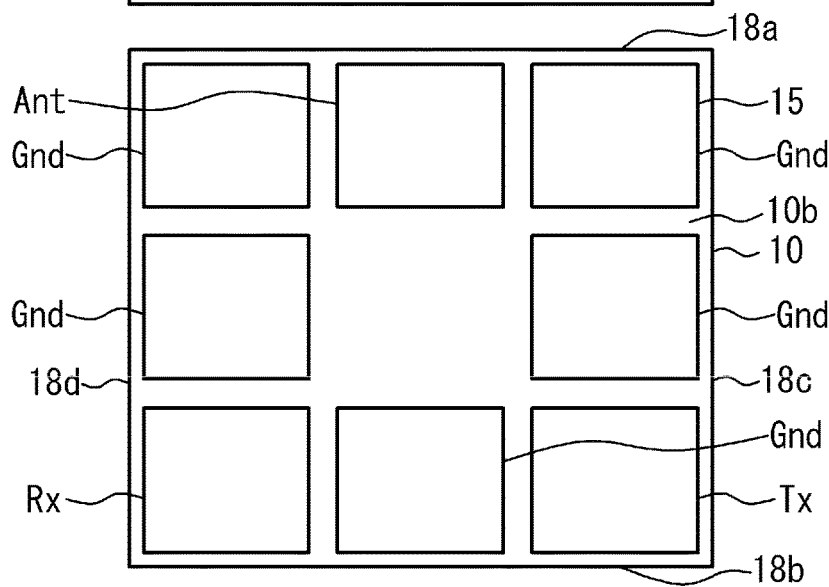

Since the circuit diagram and the cross-sectional view of a multiplexer 500 in accordance with a comparative example are the same as FIG. 1 and FIG. 2 of the first embodiment, the description thereof will be omitted. FIG. 5A to FIG. 5C are plan views of the substrates 10 and 20 in the comparative example. FIG. 5A is a plan view of the upper surface 20a of the substrate 20 as viewed from above, FIG. 5B is a plan view of the upper surface 10a of the substrate 10 as viewed from above, and FIG. 5C is a plan view of the lower surface 10b of the substrate 10 as transparently viewed from above. In FIG. 5A and FIG. 5B, the wiring lines 14 and 24 are hatched for clarity. In FIG. 5B, the transmit terminal Tx and the receive terminal Rx formed on the lower surface 10b of the substrate 10 are indicated by dotted lines.

As illustrated in FIG. 5A to FIG. 5C, the acoustic wave resonators 23 provided on the upper surface 20a of the substrate 20 include the series resonators S21 to S23 and the parallel resonators P21 and P22 constituting the receive filter 60. The acoustic wave resonators 13 provided on the upper surface 10a of the substrate 10 include the series resonators S11 to S13 and the parallel resonators P11 and P12 constituting the transmit filter 50. Since other configurations are the same as those of FIG. 4A to FIG. 4C of the first embodiment, description thereof will be omitted.

As described above, the comparative example is different from the first embodiment in that all of the series resonators S11 to S13 and the parallel resonators P11 and P12 constituting the transmit filter 50 are provided on the upper surface 10a of the substrate 10, and all of the series resonators S21 to S23 and the parallel resonators P21 and P22 constituting the receive filter 60 are provided on the upper surface 20a of the substrate 20.

Figure 6A:
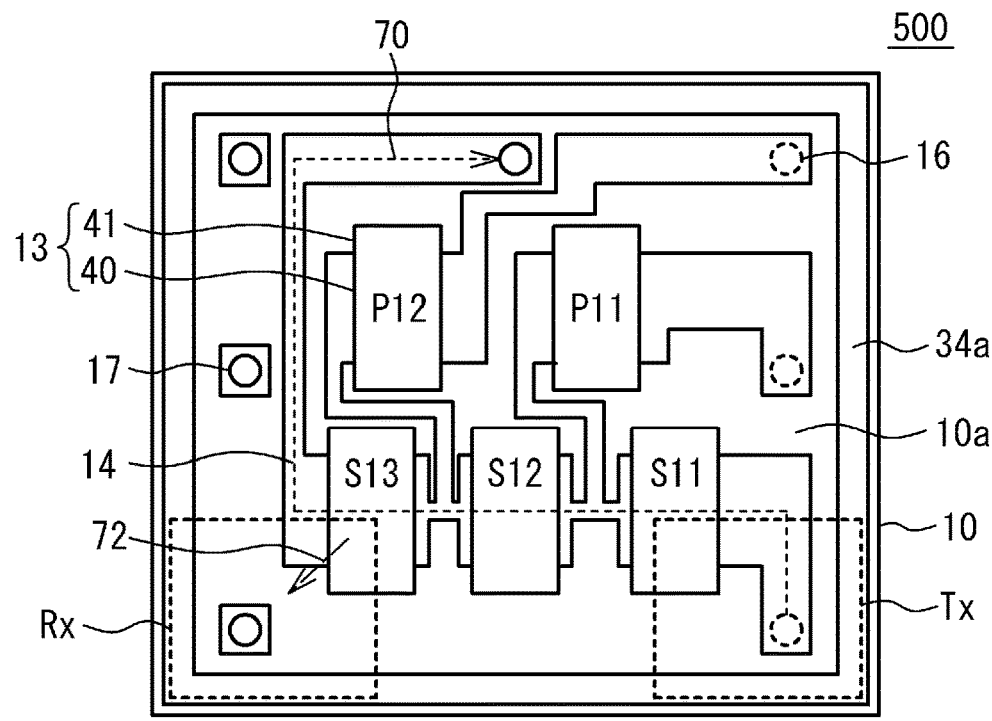
FIG. 6A is a plan view for describing a problem occurring in a multiplexer in accordance with the comparative example.
Figure 6B:
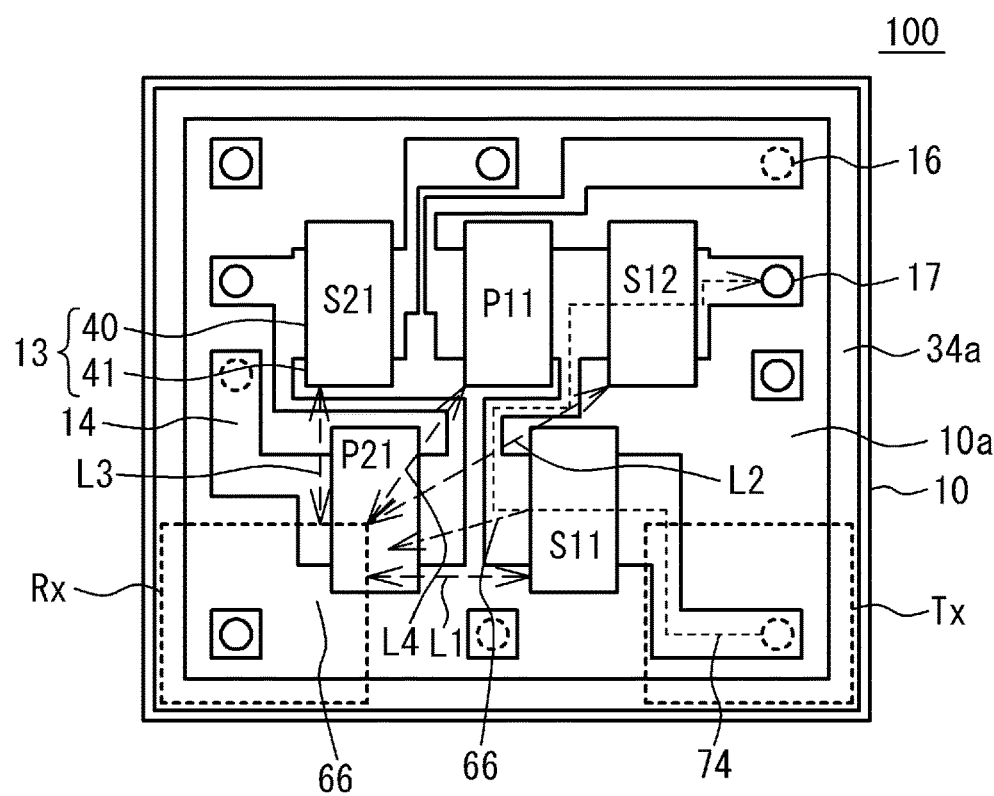
FIG. 6B is a plan view for describing advantages of the multiplexer in accordance with the first embodiment.

FIG. 6A is a plan view for describing a problem that occurs in the multiplexer 500 in accordance with the comparative example, and FIG. 6B is a plan view for describing an advantage of the multiplexer 100 in accordance with the first embodiment. As illustrated in FIG. 6A, most of the high-frequency signal input to the transmit terminal Tx flows to the common terminal Ant as indicated by an arrow 70. In this case, when the series resonator S13 is provided near the receive terminal Rx, the electromagnetic field coupling between the series resonator S13 and the receive terminal Rx becomes strong, and a signal may leak from the series resonator S13 to the receive terminal Rx as indicated by an arrow 72. As a result, the isolation characteristics are deteriorated.

In the first embodiment, as illustrated in FIG. 6B, most of the high-frequency signal input to the transmit terminal Tx flows to the common terminal Ant as indicated by an arrow 74. Among all the series resonators S11, S12, and S21 and the parallel resonators P11 and P21 provided on the upper surface 10a of the substrate 10, the resonator provided closest to the receive terminal Rx in a plan view is the parallel resonator P21 of the receive filter 60. Therefore, the series resonators S11 and S12 and the parallel resonator P11 included in the transmit filter 50 are provided away from the receive terminal Rx in a plan view. For example, in a plan view, the parallel resonator P21 overlaps the receive terminal Rx, and the distance between the parallel resonator P21 and the receive terminal Rx is zero. When the minimum distances between the receive terminal Rx and the series resonators S11, S12, S21, and the parallel resonator P11 are represented by L1, L2, L3, and L4, respectively, the distance from the receive terminal Rx decreases in the order of the series resonator S12, the parallel resonator P11, the series resonator S11, and the series resonator S21 (L2>L4>L1>L3).

As described above, since the series resonators S11 and S12 and the parallel resonator P11 included in the transmit filter 50 are provided away from the receive terminal Rx, electromagnetic field coupling between the receive terminal Rx and the series resonator S11, which is closest to the receive terminal Rx among the series resonators S11 and S12 and the parallel resonator P11, is weakened, and signal leakage from the series resonator S11 to the receive terminal Rx is inhibited. Therefore, degradation in isolation characteristics is inhibited.

In addition, since the parallel resonator P21 is provided on the minimum distance L1 between the series resonator S11 and the receive terminal Rx, electromagnetic waves from the series resonator S11 are blocked by the parallel resonator P21, and thus the degradation in isolation characteristics is further inhibited. In addition, since the resonator provided between the series resonator S11 and the receive terminal Rx is the parallel resonator P21, electromagnetic waves from the series resonator S11 are likely to fall to the ground through the parallel resonator P21 and the wiring line 14. Therefore, even when a signal leaks from the series resonator S11 to the parallel resonator P21, transmission of the leakage signal to the receive terminal Rx is inhibited. Therefore, the degradation in isolation characteristic is further inhibited.

As described above, in the first embodiment, as illustrated in FIG. 4A and FIG. 4B, the series resonators S11 and S12 and the parallel resonator P11, which are one or some of the series resonators S11 to S13 and the parallel resonators P11 and P12 (first acoustic wave resonators) constituting the transmit filter 50, are provided on the upper surface 10a of the substrate 10, and the series resonator S13 and the parallel resonator P12, which are the remainder, are provided on the upper surface 20a of the substrate 20. The series resonators S21 and the parallel resonator P21, which are one or some of the series resonators S21 to S23 and the parallel resonators P21 and P22 (second acoustic wave resonators) constituting the receive filter 60, are provided on the upper surface 10a of the substrate 10, and the series resonators S22 and S23 and the parallel resonator P22, which are the remainder, are provided on the upper surface 20a of the substrate 20. The resonator closest to the receive terminal Rx in a plan view among all the series resonators S11, S12, and S21 and the parallel resonators P11 and P21 provided on the upper surface 10a of the substrate 10 is the parallel resonator P21 of the receive filter 60. Thus, as described with reference to FIG. 6B, since the series resonators S11 and S12 and the parallel resonator P11 included in the transmit filter 50 are provided away from the receive terminal Rx, signal leakage from the series resonators S11 and S12 and the parallel resonator P11 to the receive terminal Rx is inhibited. Therefore, degradation in isolation characteristics is inhibited. In addition, since the series resonators S11 and S12 and the parallel resonator P11 included in the transmit filter 50 are provided on the upper surface 10a of the substrate 10, the heat dissipation of the series resonators S11 and S12 and the parallel resonator P11 is improved, and the reliability in power durability is improved.

In addition, in the first embodiment, as illustrated in FIG. 4B, the parallel resonator P21 of the receive filter 60 is provided on the minimum distance L between the receive terminal Rx and the series resonator S11 closest to the receive terminal Rx among the series resonators S11 and S12 and the parallel resonator P21 included in the transmit filter 50 in a plan view. Because of this configuration, as described with reference to FIG. 6B, the electromagnetic waves from the series resonator S11 are blocked by the parallel resonator P21, and thus the degradation in isolation characteristics is inhibited.

In addition, in the first embodiment, as illustrated in FIG. 4B, the resonator closest to the transmit terminal Tx in a plan view among all the series resonators S11, S12, and S21 and the parallel resonators P11 and P21 provided on the upper surface 10a of the substrate 10 is the series resonator S11 of the transmit filter 50. This configuration inhibits electromagnetic field coupling between the transmit terminal Tx and the series resonators S21 and the parallel resonators P21 included in the receive filter 60, and thus degradation in isolation characteristics is inhibited.

In addition, in the first embodiment, as illustrated in FIG. 4B, the resonator closest to the receive terminal Rx among all the series resonators S11, S12, and S21 and the parallel resonators P11 and P21 provided on the upper surface 10a of the substrate 10 is the parallel resonator P21 of the receive filter 60. Thus, as described with reference to FIG. 6B, even when a signal leaks from the series resonator S11 to the parallel resonator P21, transmission of the leakage signal to the receive terminal Rx is inhibited, and degradation in isolation characteristics is inhibited.

In addition, in the first embodiment, as illustrated in FIG. 4B, the parallel resonator P21 closest to the common terminal Ant in terms of electrical connection of the parallel resonators P21 and P22 of the receive filter 60 is the resonator physically closest to the receive terminal Rx.

When a signal leaks from the transmit filter 50 to the parallel resonator P21 closest to the common terminal Ant in terms of electrical connection of the parallel resonators P21 and P22 of the receive filter 60, the leakage signal is transmitted to the receive terminal Rx through the series resonators S22 and S23 as illustrated in FIG. 1, and thus the strength of the leakage signal when reaching the receive terminal Rx is reduced. Therefore, by configuring the parallel resonator P21 closest to the common terminal Ant in terms of electrical connection of the parallel resonators P21 and P22 of the receive filter 60 to be the resonator physically closest to the receive terminal Rx, degradation in isolation characteristics is inhibited.

In addition, in the first embodiment, as illustrated in FIG. 4A, the series resonator S23 closest to the receive terminal Rx in terms of electrical connection among the series resonators S23 to S23 of the receive filter 60 and the parallel resonator P22 closest to the receive terminal Rx in terms of electrical connection of the parallel resonators P21 and P22 of the receive filter 60 are provided on the upper surface 20a of the substrate 20. When a signal leaks from the transmit filter 50 to the series resonator S23 and the parallel resonator P22 that are closest to the receive terminal Rx in terms of electrical connection among the resonators constituting the receive filter 60, the strength of the leakage signal when the leakage signal reaches the receive terminal Rx increases, and thus the isolation characteristics are significantly affected. Therefore, by providing the series resonator S23 and the parallel resonator P22 having a large influence on the isolation characteristics on the upper surface 20a of the substrate 20, the wiring distance between the series resonator S23 and the receive terminal Rx and the wiring distance between the parallel resonator P22 and the receive terminal Rx are increased, and the intensity of the leakage signal is weakened. Thus, the degradation in isolation characteristics is inhibited.

In addition, in the first embodiment, as illustrated in FIG. 4B, at least a part of the parallel resonator P21 provided closest to the receive terminal Rx overlaps the receive terminal Rx in a plan view. Thus, the multiplexer 100 can be miniaturized. To miniaturize the multiplexer 100, ¼ or more of the parallel resonator P21 preferably overlaps with the receive terminal Rx, more preferably, ⅓ or more of the parallel resonator P21 overlaps with the receive terminal Rx, and further preferably, ½ or more of the parallel resonator P21 overlaps with the receive terminal Rx. To miniaturize the multiplexer 100, at least a part of the series resonator S11 provided closest to the transmit terminal Tx in a plan view may overlap the transmit terminal Tx.

In addition, in the first embodiment, as illustrated in FIG. 4B, the series resonator S11 closest to the transmit terminal Tx in terms of electrical connection among the series resonators S11 to S13 of the transmit filter 50 and the parallel resonator P11 closest to the transmit terminal Tx in terms of electrical connection of the parallel resonators P11 and P12 of the transmit filter 50 are provided on the upper surface 10a of the substrate 10. A large amount of power is applied to the series resonator S11 and the parallel resonator P11 that are closest to the transmit terminal Tx in terms of electrical connection, and the series resonator S11 and the parallel resonator P11 therefore generate a large amount of heat. Therefore, by providing the series resonator S11 and the parallel resonator P11 on the upper surface 10a of the substrate 10, the heat dissipation is improved and the reliability in power durability is improved.

In the first embodiment, as illustrated in FIG. 4A, the series resonator S13 closest to the common terminal Ant in terms of electrical connection among the series resonators S11 to S13 of the transmit filter 50 and the parallel resonator P12 closest to the common terminal Ant in terms of electrical connection of the parallel resonators P11 and P12 of the transmit filter 50 are provided on the upper surface 20a of the substrate 20. Since the series resonator S13 and the parallel resonator P12 generate less heat than other resonators of the transmit filter 50, the series resonator S13 and the parallel resonator P12 can be provided on the upper surface 20a of the substrate 20. In addition, when a high-frequency signal input to the transmit terminal Tx is transmitted to the series resonator S13 and the parallel resonator P12 closest to the common terminal Ant in terms of electrical connection, the high-frequency signal is attenuated by the resonators between the transmit terminal Tx and the series resonators S13 and the parallel resonator P12. Therefore, even when a signal leaks from the series resonator S13 and the parallel resonator P12 to the receive filter 60, the influence on the isolation characteristics is relatively small.

In the first embodiment, as illustrated in FIG. 2, the shield layer 28 connected to the ground is provided between the acoustic wave resonators 13 provided on the upper surface 10a of the substrate 10 and the acoustic wave resonators 23 provided on the upper surface 20a of the substrate 20. This configuration inhibits the electromagnetic field coupling between the series resonators S11, S12, and S21 and the parallel resonators P11 and P21 provided on the upper surface 10a of the substrate 10 and the series resonators S13, S22, and S23 and the parallel resonators P12 and P22 provided on the upper surface 20a of the substrate 20.

In the first embodiment, as illustrated in FIG. 4A and FIG. 4B, the series resonator S13 and the parallel resonator P12 of the transmit filter 50 are provided on the upper surface 20a of the substrate 20, and the series resonators S11 and S12 and the parallel resonator P11 of the transmit filter 50 are provided on the upper surface 10a of the substrate 10. As described above, the resonators constituting the transmit filter 50 are divided in substantially half and disposed on the substrate 10 and the substrate 20, respectively, thereby reducing the size of the multiplexer 100. To miniaturize the multiplexer 100, the number of resonators of the transmit filter 50 provided on the upper surface 10a of the substrate 10 is preferably the same as the number of resonators of the transmit filter 50 provided on the upper surface 20a of the substrate 20 or different from the number of resonators of the transmit filter 50 provided on the upper surface 20a of the substrate 20 by one. The same applies to the receive filter 60. In addition, to miniaturize the multiplexer 100, the total number of resonators of the transmit filter 50 and the receive filter 60 provided on the upper surface 20a of the substrate 20 is preferably equal to the total number of resonators of the transmit filter 50 and the receive filter 60 provided on the upper surface 10a of the substrate 10 or different from the total number of resonators of the transmit filter 50 and the receive filter 60 provided on the upper surface 10a of the substrate 10 by one.

In addition, in the first embodiment, as illustrated in FIG. 4A and FIG. 4B, the parallel resonator P11 of the transmit filter 50 is provided between the series resonator S12 of the transmit filter 50 and the series resonator S21 of the receive filter 60, and the parallel resonator P22 of the receive filter 60 is provided between the series resonator S13 of the transmit filter 50 and the series resonator S22 of the receive filter 60. With such an arrangement, degradation in isolation characteristics is inhibited.

Second Embodiment

Figure 7:
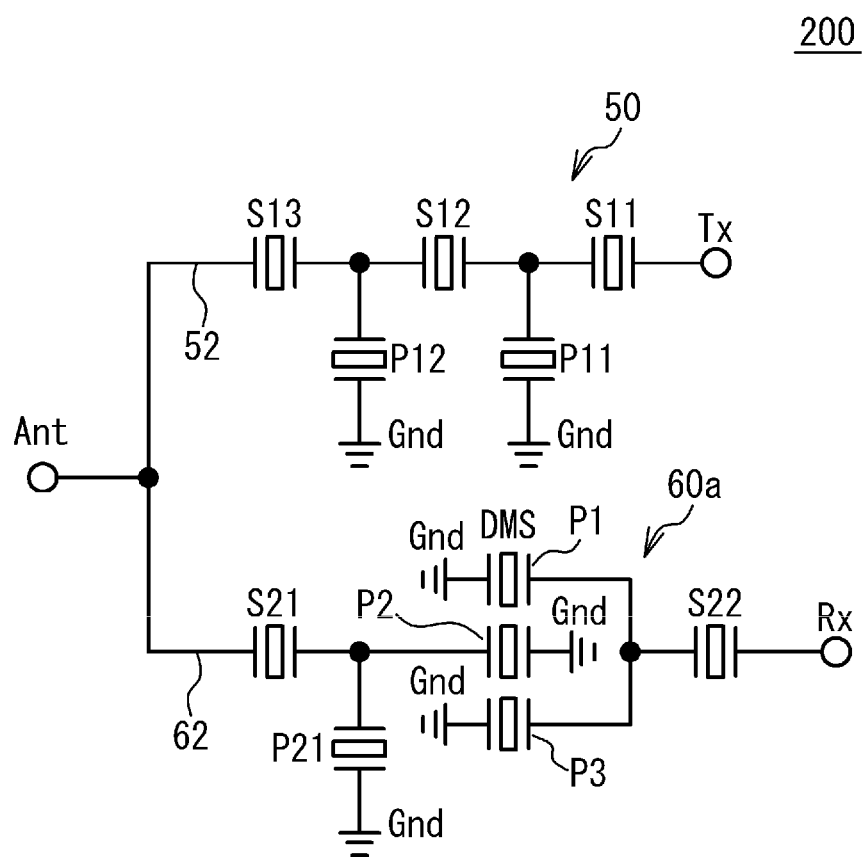
FIG. 7 is a circuit diagram of a multiplexer in accordance with a second embodiment.

FIG. 7 is a circuit diagram of a multiplexer 200 in accordance with a second embodiment. As illustrated in FIG. 7, the transmit filter 50 connected between the transmit terminal Tx and the common terminal Ant is a ladder-type filter as in the first embodiment, and includes the series resonators S11 to S13 and the parallel resonators P11 and P12. A receive filter 60a connected between the common terminal Ant and the receive terminal Rx includes the series resonator S21, a longitudinally coupled double mode resonator DMS, and the series resonator S22 that are connected in series between the common terminal Ant and the receive terminal Rx, and the parallel resonator P21 connected in parallel between the common terminal Ant and the receive terminal Rx. The series resonator S21, the longitudinally coupled double mode resonator DMS, and the series resonator S22 are provided in the series path 62 between the common terminal Ant and the receive terminal Rx. A first end of the parallel resonator P21 is connected to the series path 62, and a second end thereof is connected to the ground terminal Gnd. The longitudinally coupled double mode resonator DMS includes a plurality of acoustic wave resonators P1 to P3. A first end, which is closer to the common terminal Ant, of the central acoustic wave resonator P2 is connected to the series path 62, and a second end opposite to the first end is connected to the ground terminal Gnd. First ends, which are closer to the receive terminal Rx, of the acoustic wave resonators P1 and P3 provided with the acoustic wave resonator P2 interposed therebetween are connected to the series path 62, and second ends opposite to the first ends are connected to the ground terminals Gnd.

Figure 8A:
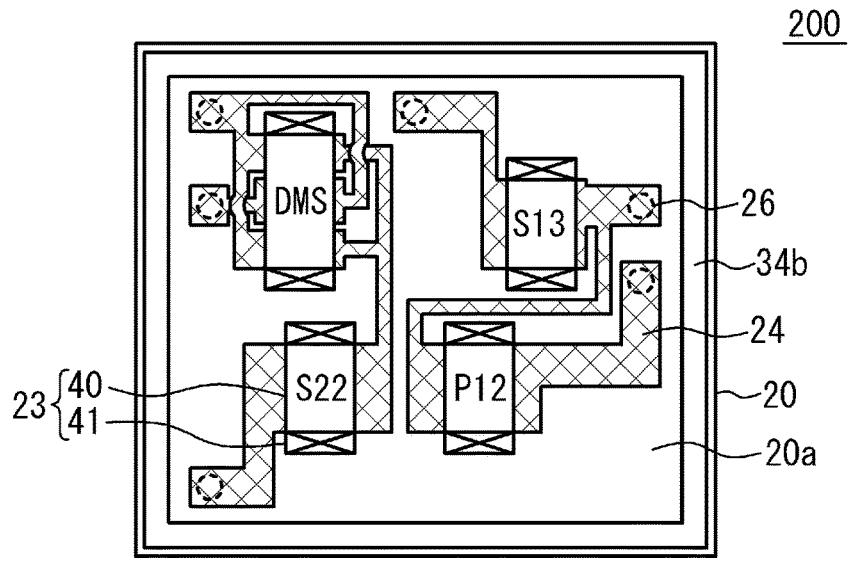
FIG. 8A to FIG. 8C are plan views of a substrate in the second embodiment.
Figure 8B:
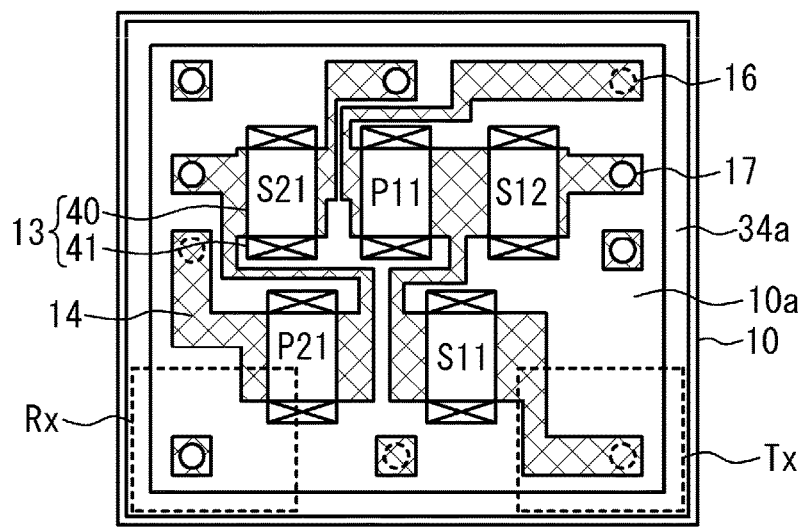
Figure 8C:
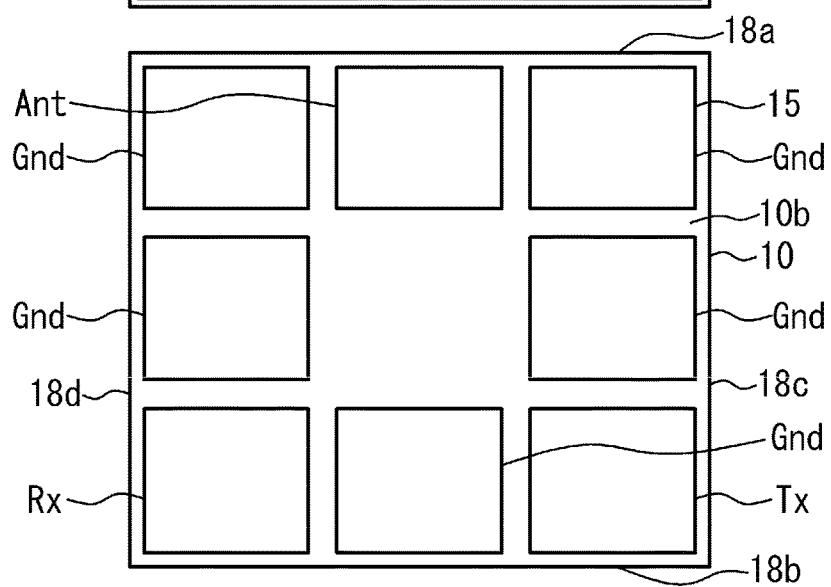

Since the cross-sectional view of the multiplexer 200 in accordance with the second embodiment is the same as FIG. 2 of the first embodiment, the description thereof is omitted. FIG. 8A to FIG. 8C are plan views of the substrates 10 and 20 in the second embodiment. FIG. 8A is a plan view of the upper surface 20a of the substrate 20 as viewed from above, FIG. 8B is a plan view of the upper surface 10a of the substrate 10 as viewed from above, and FIG. 8C is a plan view of the lower surface 10b of the substrate 10 as transparently viewed from above. In FIG. 8A and FIG. 8B, the wiring lines 14 and 24 are hatched for clarity. In FIG. 8B, the transmit terminal Tx and the receive terminal Rx formed on the lower surface 10b of the substrate 10 are indicated by dotted lines.

As illustrated in FIG. 8A to FIG. 8C, the acoustic wave resonators 23 and the wiring lines 24 are provided on the upper surface 20a of the substrate 20. The acoustic wave resonators 23 include the series resonator S13 and the parallel resonator P12 included in the transmit filter 50, and the longitudinally coupled double mode resonator DMS and the series resonator S22 included in the receive filter 60a. The acoustic wave resonators 13 and the wiring lines 14 are provided on the upper surface 10a of the substrate 10. The acoustic wave resonators 13 include the series resonators S11 and S12 and the parallel resonator P11 included in the transmit filter 50, and the series resonator S21 and the parallel resonator P21 included in the receive filter 60a. Since other configurations are the same as those of FIG. 4A to FIG. 4C of the first embodiment, the description thereof will be omitted.

In the second embodiment, the series resonators S11 and S12 and the parallel resonator P11, which are one or some of the series resonators S11 to S13 and the parallel resonators P11 and P12 constituting the transmit filter 50, are provided on the upper surface 10a of the substrate 10, and the series resonator S13 and the parallel resonator P12, which are the remainder, are provided on the upper surface 20a of the substrate 20. The series resonator S21 and the parallel resonator P21, which are one or some of the series resonators S21 and S22, the longitudinally-coupled double-mode resonator DMS, and the parallel resonator P21 constituting the receive filter 60a, are provided on the upper surface 10a of the substrate 10, and the series resonator S22 and the longitudinally coupled double mode resonator DMS, which are the remainder, are provided on the upper surface 20a of the substrate 20. Among all the series resonators S11, S12, and S21 and the parallel resonators P11 and P21 provided on the upper surface 10a of the substrate 10, the resonator closest to the receive terminal Rx in a plan view is the parallel resonator P21 of the receive filter 60a. This configuration improves the reliability in power durability and inhibits the degradation in isolation characteristics, as in the first embodiment.

In addition, in the second embodiment, the series resonator S22 and the longitudinally coupled double mode resonator DMS included in the receive filter 60a are provided on the upper surface 20a of the substrate 20, and the series resonator S21 and the parallel resonator P21 included in the receive filter 60a are provided on the upper surface 10a of the substrate 10. As described above, the resonators constituting the receive filter 60a are separately disposed on the substrate 10 and the substrate 20, and the size of the multiplexer 200 is thereby reduced. To reduce the size of the multiplexer 200, in the receive filter 60a, the number of series resonators and parallel resonators provided on the substrate on which the longitudinally coupled double mode resonator DMS is also provided is preferably smaller than the number of series resonators and parallel resonators provided on the other substrate. The total number of series resonators and parallel resonators of the transmit filter 50 and the receive filter 60a provided on the substrate on which the longitudinally coupled double mode resonator DMS is also provided is preferably smaller than the total number of series resonators and parallel resonators of the transmit filter 50 and the receive filter 60a provided on the other substrate.

Third Embodiment

Figure 9:
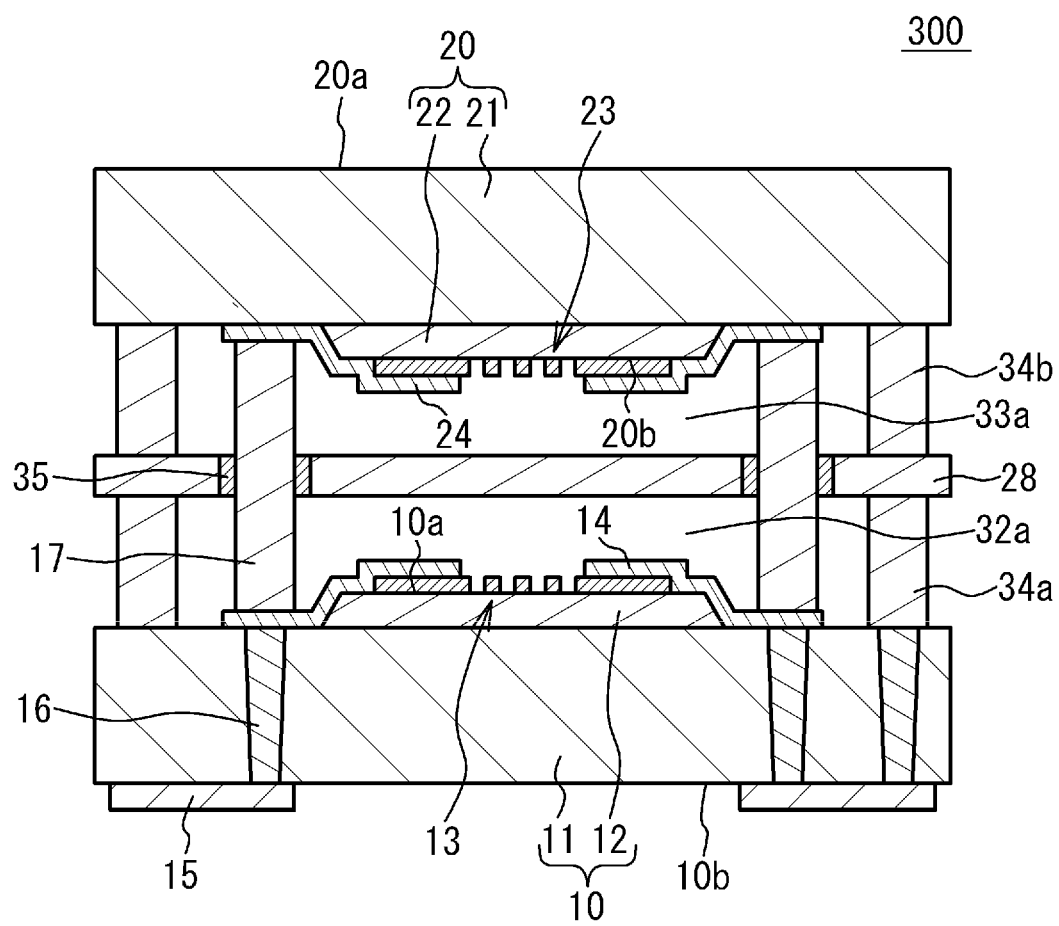
FIG. 9 is a cross-sectional view of a multiplexer in accordance with a third embodiment.

Since the circuit diagram of a multiplexer 300 in accordance with a third embodiment is the same as FIG. 1 of the first embodiment, the description thereof will be omitted. FIG. 9 is a cross-sectional view of the multiplexer 300 in accordance with the third embodiment. As illustrated in FIG. 9, the acoustic wave resonators 23 and the wiring lines 24 are provided on the lower surface 20b of the substrate 20 opposite to the upper surface 10a of the substrate 10 on which the acoustic wave resonators 13 and the wiring lines 14 are provided. The shield layer 28 is provided between the upper surface 10a of the substrate 10 and the lower surface 20b of the substrate 20 and between the acoustic wave resonators 13 and the acoustic wave resonators 23.

Openings are provided in the shield layer 28, and the pillars 17 pass through the respective openings. An insulating resin film 35 is provided between the pillars 17 and the shield layer 28. Thus, the pillars 17 and the shield layer 28 are electrically insulated from each other. The pillar 17 is connected between the wiring line 14 and the wiring line 24. The upper surface 10a of the substrate 10 and the shield layer 28 face each other across an air gap 32a. The acoustic wave resonators 13 and the wiring lines 14 are sealed in the air gap 32a by the sealing portion 34a provided between the substrate 10 and the shield layer 28. The lower surface 20b of the substrate 20 and the shield layer 28 face each other across an air gap 33a. The acoustic wave resonators 23 and the wiring lines 24 are sealed in the air gap 33a by the sealing portion 34b provided between the substrate 20 and the shield layer 28. Other configurations are the same as those in FIG. 2 of the first embodiment, and thus description thereof will be omitted. In a case in which a sufficient distance can be secured between the shield layer 28 and the pillar 17, the resin film 35 may not be necessarily provided, and the shield layer 28 and the pillar 17 may be insulated with an air gap interposed therebetween. In this case, the air gap 32a and the air gap 33a are communicated with each other.

Since the arrangement of the acoustic wave resonators 13 provided on the upper surface 10a of the substrate 10 is the same as that in FIG. 4B of the first embodiment and the arrangement of the acoustic wave resonators 23 provided on the lower surface 20b of the substrate 20 are the same as those in FIG. 4A of the first embodiment, illustration and description thereof will be omitted.

The acoustic wave resonators 23 and the wiring lines 24 provided on the substrate 20 may be provided on the upper surface 20a of the substrate 20 opposite from the substrate 10 as illustrated in FIG. 2, or may be provided on the lower surface 20b closer to the substrate 10 as illustrated in FIG. 9.

The number of series resonators, parallel resonators, and longitudinally coupled double mode resonators of each filter in the first to third embodiments can be set as appropriate. Although the duplexer has been described as an example of the multiplexer in the first to third embodiments, the multiplexer may be a triplexer or a quadplexer.

Although the embodiment of the present invention has been described in detail above, the present invention is not limited to the specific embodiment, and various modifications and changes can be made within the scope of the gist of the present invention described in the claims.

What is claimed is:

1. A multiplexer comprising:
a first substrate having a first surface and a second surface, the first surface and the second surface being opposite to each other;
a second substrate that has a third surface and is mounted over the first substrate with an air gap interposed between the first surface and the second substrate;
a common terminal, a transmit terminal, and a receive terminal provided on the second surface;
a transmit filter including a plurality of first acoustic wave resonators connected to a first path between the common terminal and the transmit terminal, one or some first acoustic wave resonators of the plurality of first acoustic wave resonators being provided on the first surface, and remaining one or more first acoustic wave resonators being provided on the third surface; and
a receive filter including a plurality of second acoustic wave resonators connected to a second path between the common terminal and the receive terminal, one or some second acoustic wave resonators of the plurality of second acoustic wave resonators being provided on the first surface, and remaining one or more second acoustic wave resonators being provided on the third surface,
wherein a resonator closest to the receive terminal in a plan view among the one or some first acoustic wave resonators and the one or some second acoustic wave resonators being a second acoustic wave resonator of the one or some second acoustic wave resonators,
wherein the plurality of second acoustic wave resonators include a plurality of second parallel resonators each having a first end connected to the second path and a second end connected to a ground, and
wherein the second acoustic wave resonator physically closest to the receive terminal is a second parallel resonator closest to the common terminal in terms of electrical connection among the plurality of second parallel resonators.

2. The multiplexer according to claim 1, wherein in a plan view, the second acoustic wave resonator closest to the receive terminal is provided on a path of minimum distance between the receive terminal and a first acoustic wave resonator closest to the receive terminal among the one or some first acoustic wave resonators.

3. The multiplexer according to claim 1, wherein a resonator closest to the transmit terminal in a plan view among the one or some first acoustic wave resonators and the one or some second acoustic wave resonators is a first acoustic wave resonator of the one or some first acoustic wave resonators.

4. The multiplexer according to claim 1,
wherein the plurality of first acoustic wave resonators include a plurality of first series resonators connected in series with the first path and a plurality of first parallel resonators each having a first end connected to the first path and a second end connected to a ground, and
wherein the first acoustic wave resonators provided on the first surface include: a first series resonator closest to the transmit terminal in terms of electrical connection among the plurality of first series resonators, and a first parallel resonator closest to the transmit terminal in terms of electrical connection among the plurality of first parallel resonators.

5. The multiplexer according to claim 4, wherein the remaining first acoustic wave resonators provided on the third surface include: a first series resonator closest to the common terminal in terms of electrical connection among the plurality of first series resonators, and a first parallel resonator closest to the common terminal in terms of electrical connection among the plurality of first parallel resonators.

6. The multiplexer according to claim 1,
wherein the plurality of second acoustic wave resonators include a plurality of second series resonators connected in series with the second path, and
wherein the remaining second acoustic wave resonators provided on the third surface include a second series resonator closest to the receive terminal in terms of electrical connection among the plurality of second series resonators, and a second parallel resonator closest to the receive terminal in terms of electrical connection among the plurality of second parallel resonators.

7. The multiplexer according to claim 1, wherein at least a part of the second acoustic wave resonator closest to the receive terminal overlaps the receive terminal in a plan view.

8. The multiplexer according to claim 1, further comprising:
a shield layer provided between:
the one or some first acoustic wave resonators and the one or some second acoustic wave resonators, all of which are provided on the first surface, and
the remaining first acoustic wave resonator and the remaining second acoustic wave resonator, all of which are provided on the third surface,
wherein the shield layer is connected to a ground.

* * * * *